(12) United States Patent
Montgomery et al.

(10) Patent No.: US 11,968,858 B2
(45) Date of Patent: Apr. 23, 2024

(54) DISPLAY SUBPIXELS HAVING MULTIPLE EMISSIVE AREAS WITH HIGH ASPECT RATIOS

(71) Applicant: Sharp Display Technology Corporation, Kameyama (JP)

(72) Inventors: David James Montgomery, Bampton (GB); Hywel Hopkin, Oxford (GB)

(73) Assignee: Sharp Display Technology Corporation, Kameyama (JP)

( * ) Notice: Subject to any disclaimer, the term of this patent is extended or adjusted under 35 U.S.C. 154(b) by 176 days.

(21) Appl. No.: 17/465,053

(22) Filed: Sep. 2, 2021

(65) Prior Publication Data

US 2023/0066311 A1    Mar. 2, 2023

(51) Int. Cl.
*H10K 59/122* (2023.01)
*H10K 50/818* (2023.01)
*H10K 50/828* (2023.01)
*H10K 59/35* (2023.01)

(52) U.S. Cl.
CPC ......... *H10K 59/122* (2023.02); *H10K 50/818* (2023.02); *H10K 50/828* (2023.02); *H10K 59/353* (2023.02)

(58) Field of Classification Search
CPC .. H10K 59/122; H10K 59/353; H10K 50/818; H10K 50/828
USPC .......................................................... 257/40
See application file for complete search history.

(56) References Cited

U.S. PATENT DOCUMENTS

| 7,091,658 B2 | 8/2006 | Ito et al. |
| 8,207,668 B2 | 6/2012 | Cok et al. |
| 8,587,742 B2 | 11/2013 | Kimura et al. |
| 8,894,243 B2 | 11/2014 | Cho et al. |
| 9,029,843 B2 | 5/2015 | Harada et al. |
| 9,337,242 B2 | 5/2016 | Furuie |

(Continued)

FOREIGN PATENT DOCUMENTS

| CN | 106876566 A | 6/2017 |
| JP | 6274771 B2 | 2/2018 |

(Continued)

OTHER PUBLICATIONS

Unpublished co-pending U.S. Appl. No. 16/908,659.

(Continued)

*Primary Examiner* — Xia L Cross
(74) *Attorney, Agent, or Firm* — ScienBiziP, P.C.

(57) ABSTRACT

A top-emitting subpixel structure may include at least one bank structure defining a plurality of emissive areas, and an emissive structure located in each emissive area. The subpixel structure may have a subpixel length and a subpixel width less than the subpixel length, a ratio of the subpixel length to the subpixel width defining a subpixel aspect ratio. Each emissive area may have an emissive area length and an emissive area width shorter than the emissive area length, a ratio of the emissive area length to the emissive area width defining an emissive area aspect ratio. The subpixel length may define a primary axis when the subpixel aspect ratio is greater than the emissive area aspect ratio; otherwise, the emissive area length may define the primary axis. At least a majority of the emissive areas may be arranged successively widthwise along a secondary axis perpendicular to the primary axis.

20 Claims, 10 Drawing Sheets

(56) References Cited

U.S. PATENT DOCUMENTS

| | | |
|---|---|---|
| 9,524,669 B2 | 12/2016 | Sato |
| 9,583,727 B2 | 2/2017 | Cho et al. |
| 9,680,133 B2 | 6/2017 | Lee et al. |
| 10,090,489 B2 | 10/2018 | Uchida et al. |
| 10,103,205 B2 | 10/2018 | Gu et al. |
| 10,401,691 B2 | 9/2019 | Yang et al. |
| 2006/0158098 A1 | 7/2006 | Raychaudhuri et al. |
| 2008/0030132 A1* | 2/2008 | Adachi ............... H10K 59/124 313/506 |
| 2015/0084012 A1 | 3/2015 | Kim et al. |
| 2017/0084877 A1* | 3/2017 | Lee .................... H10K 59/121 |
| 2017/0110519 A1 | 4/2017 | Hsu |
| 2017/0160602 A1* | 6/2017 | Yang ................ G02F 1/134336 |
| 2019/0027092 A1* | 1/2019 | Matsueda ............ H10K 50/818 |
| 2019/0103518 A1 | 4/2019 | Lamkin |
| 2019/0372055 A1* | 12/2019 | Wu ..................... H10K 50/858 |

FOREIGN PATENT DOCUMENTS

| | | |
|---|---|---|
| KR | 20150020140 A | 2/2015 |
| WO | 2017/205174 A1 | 11/2017 |

OTHER PUBLICATIONS

Lee et al., "Three-dimensional pixel configurations for optical outcoupling of OLED displays—optical simulation" Proceedings SID Display Week 2019, published 2019.

\* cited by examiner

DISPLAY SUBPIXELS HAVING MULTIPLE EMISSIVE AREAS WITH HIGH ASPECT RATIOS

FIELD

The present disclosure generally relates to emissive light-emitting diode (LED) displays (e.g., quantum-dot LED (QLED) and organic LED (OLED) displays) and, in particular, relates to subpixels having multiple emissive areas with high aspect ratios.

BACKGROUND

QLEDs and OLEDs represent emerging emissive display technologies. An ongoing focus of development of these display technologies is improvement in brightness and efficiency. To that end, various pixel structure or "cavity" enhancements have been proposed, such as the use of dispersive layers to enhance the extraction of light from the cavity that is generated by an emissive layer of the cavity. However, such modifications to the pixel cavity are typically difficult to manufacture due to the extremely small sizes of the pixel features involved, thus complicating the process control required to deposit the layers of the cavity.

One alternative to modifying the layers is to use a relatively thick top "filler" layer with a high refractive index, which may reduce Fresnel reflections and increase transmissivity through a top electrode of the cavity. However, at least some of the light in the filler layer may be primarily trapped therein by total internal reflection (TIR). To extract this trapped light, reflective and/or scattering bank structures may surround the filler layer to out-couple the trapped light.

Other structures for enhancing the brightness of a sub-pixel (e.g., a red, green, or blue sub-pixel of a pixel) have also been contemplated to maximize pixel efficiency and/or brightness. However, most such designs do not consider the resulting potential increase in electrical current density and its effect on display lifetime.

SUMMARY

The present disclosure is directed to LED-based displays with sub-pixels having multiple emissive areas with high aspect ratios (e.g., to provide improved efficiency, brightness, and the like while minimizing current density).

In accordance with a first aspect of the present disclosure, a top-emitting subpixel structure may include at least one bank structure disposed on a substrate and having reflective non-vertical surfaces defining a plurality of emissive areas of a subpixel configured to emit light of a first color, and an emissive structure located in each emissive area. The emissive structure may include a reflective bottom electrode disposed over the substrate, an emissive layer disposed over the reflective bottom electrode, a transparent top electrode disposed over the emissive layer, and a filler layer disposed atop and in contact with the transparent top electrode. The filler layer may have a refractive index substantially equal to a refractive index of the transparent top electrode. The subpixel structure may have a subpixel length and a subpixel width less than the subpixel length, and a ratio of the subpixel length to the subpixel width may define a subpixel aspect ratio. Each emissive area may have an emissive area length and an emissive area width less than the emissive area length, and a ratio of the emissive area length to the emissive area width may define an emissive area aspect ratio. The subpixel length may define a primary axis when the subpixel aspect ratio is greater than the emissive area aspect ratio; otherwise, the emissive area length may define the primary axis. At least a majority of the plurality of emissive areas may be arranged successively widthwise along a secondary axis perpendicular to the primary axis.

In an implementation of the first aspect, the at least a majority of the plurality of emissive areas may include an entirety of the plurality of emissive areas.

In another implementation of the first aspect, the top-emitting subpixel structure may further include a glass cover material disposed over the filler layer and an intermediate layer disposed between the filler layer and the glass cover material. The intermediate layer may have a refractive index lower than the refractive index of the filler layer.

In another implementation of the first aspect, the glass cover material may be common to the plurality of emissive layers.

In another implementation of the first aspect, the intermediate layer may include air.

In another implementation of the first aspect, a distance between the reflective bottom electrode and the emissive layer may be configured to generate a first light emission peak directed normal to the emissive layer and a second light emission peak directed at an angle to the emissive layer within the filler layer such that light of the second light emission peak is reflected by total internal reflection at an upper interface of the filler layer toward at least one of the reflective non-vertical surfaces of the at least one bank structure.

In another implementation of the first aspect, the at least one of the reflective non-vertical surfaces may be angled such that the light of the second light emission peak is directed from the at least one of the reflective non-vertical surfaces normal to the emissive layer.

In another implementation of the first aspect, each emissive area may define a first end and a second end along the primary axis, the first ends of the plurality of emissive areas may align perpendicularly to the primary axis, and the second ends of the plurality of emissive areas may align perpendicularly to the primary axis.

In another implementation of the first aspect, each emissive area may define a first end and a second end along the primary axis, the first ends of the plurality of emissive areas may not align perpendicularly to the primary axis, and the second ends of the plurality of emissive areas may not align perpendicularly to the primary axis.

In another implementation of the first aspect, the reflective bottom electrodes of the emissive structures may be driven by a common control signal.

In another implementation of the first aspect, at least one of the plurality of emissive areas may include a rectangular shape.

In another implementation of the first aspect, at least one of the plurality of emissive areas may include a geometric stadium shape.

In accordance with a second aspect of the present disclosure, a display device may include a plurality of pixels, each pixel including a plurality of subpixels, and each subpixel of a pixel being configured to emit light of a corresponding color. Each subpixel may include at least one bank structure disposed on a substrate and having reflective non-vertical surfaces defining a plurality of emissive areas, and an emissive structure located in each emissive area. The emissive structure may include a reflective bottom electrode disposed over the substrate, an emissive layer disposed over the reflective bottom electrode, a transparent top electrode disposed over the emissive layer, and a filler layer disposed atop and in contact with the transparent top electrode. The filler layer may have a refractive index substantially equal to a refractive index of the transparent top electrode. The subpixel may have a subpixel length and a subpixel width less than the subpixel length, and a ratio of the subpixel length to the subpixel width may define a subpixel aspect ratio. Each emissive area may have an emissive area length and an emissive area width less than the emissive area length, and a ratio of the emissive area length to the emissive area width may define an emissive area aspect ratio. At least a majority of the plurality of emissive areas may be arranged successively widthwise along a secondary axis perpendicular to the primary axis.

In an implementation of the second aspect, a distance between the reflective bottom electrode and the emissive layer may be configured to generate a first light emission peak directed normal to the emissive layer, and a second light emission peak directed at an angle to the emissive layer within the filler layer such that light of the second light emission peak is reflected by total internal reflection at an upper interface of the filler layer toward at least one of the reflective non-vertical surfaces of the at least one bank structure. The at least one of the reflective non-vertical surfaces may be angled such that the light of the second light emission peak is directed from the at least one of the reflective non-vertical surfaces normal to the emissive layer.

In another implementation of the second aspect, the primary axis associated with a first subpixel of a pixel may not be parallel to the primary axis associated with a second subpixel of the pixel.

In another implementation of the second aspect, a number of emissive areas of each subpixel of a pixel may be equal.

In another implementation of the second aspect, a number of emissive areas of a first subpixel of a pixel may not equal to a number of emissive areas of a second subpixel of the pixel.

In another implementation of the second aspect, a size of each emissive area of each subpixel of a pixel may be equal.

In another implementation of the second aspect, a size of an emissive area of a first subpixel of a pixel may not be equal to a size of at least one emissive area of a second subpixel of the pixel.

In another implementation of the second aspect, each emissive area of at least one subpixel of a pixel may include a geometric stadium shape.

BRIEF DESCRIPTION OF DRAWINGS

Aspects of the example disclosure are best understood from the following detailed description when read with the accompanying figures. Various features are not drawn to scale. Dimensions of various features may be arbitrarily increased or reduced for clarity of discussion.

DESCRIPTION

Figure 1:
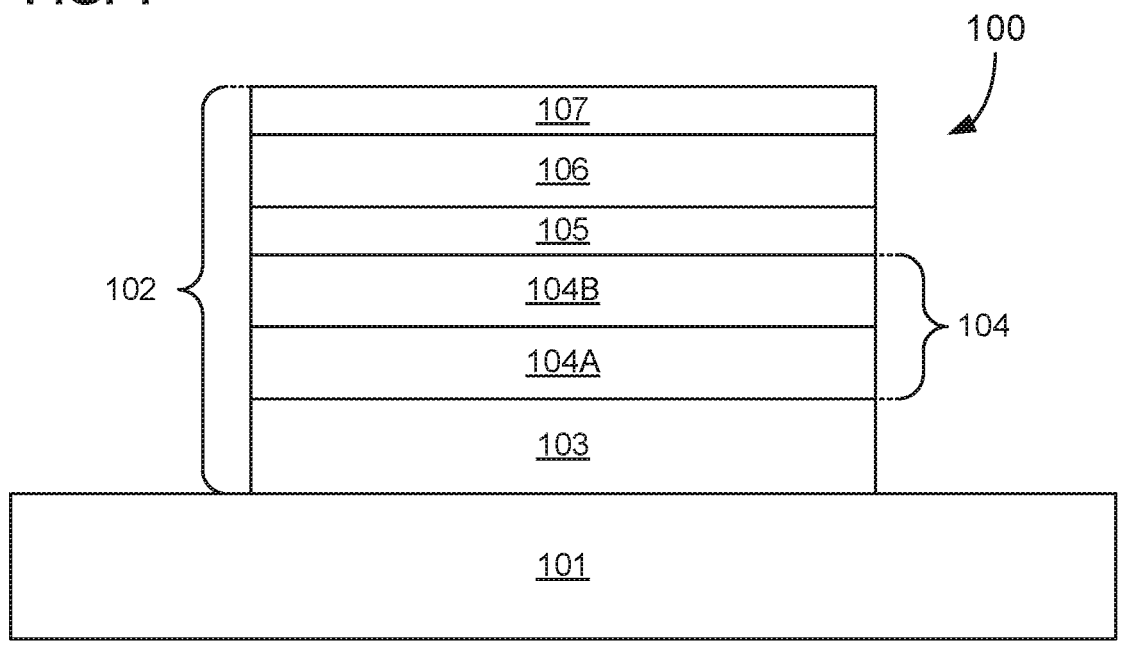
FIG. 1 is a cross-sectional side view of a top-emitting QLED subpixel stack positioned atop a substrate, in accordance with an example implementation of the present disclosure.

The following description contains specific information pertaining to exemplary implementations in the present disclosure. The drawings and their accompanying detailed description are directed to exemplary implementations. However, the present disclosure is not limited to these exemplary implementations. Other variations and implementations of the present disclosure will occur to those skilled in the art. Unless noted otherwise, like or corresponding elements in the figures may be indicated by like or corresponding reference numerals. Moreover, the drawings and illustrations are generally not to scale and are not intended to correspond to actual relative dimensions.

For consistency and ease of understanding, like features are identified (although, in some examples, not shown) by numerals in the exemplary figures. However, the features in different implementations may be different in other respects, and therefore will not be narrowly confined to what is shown in the figures.

The phrases "in one implementation" and "in some implementations" may each refer to one or more of the same or different implementations. The term "coupled" is defined as connected, whether directly or indirectly via intervening components, and is not necessarily limited to physical connections. The term "comprising" means "including, but not necessarily limited to" and specifically indicates open-ended inclusion or membership in the described combination, group, series, and equivalent.

Additionally, any two or more of the following paragraphs, (sub-)bullets, points, actions, behaviors, terms, alternatives, examples, or claims described in the following disclosure may be combined logically, reasonably, and properly to form a specific method. Any sentence, paragraph, (sub-)bullet, point, action, behavior, term, or claim described in the following disclosure may be implemented independently and separately to form a specific method. Dependency, e.g., "according to", "more specifically", "preferably", "in some implementations", "in one implementation", "in some embodiments", "in one embodiment", "in one alternative", etc., in the following disclosure refers to just one possible example which would not restrict the specific method.

For explanation and non-limitation, specific details, such as functional entities, techniques, protocols, and standards, are set forth for providing an understanding of the described technology. In other examples, detailed description of well-known methods, technologies, systems, and architectures are omitted so as not to obscure the description with unnecessary details.

Also, while certain directional references (e.g., top, bottom, up, down, height, width, and so on) are employed in the description below and appended claims, such references are utilized to provide guidance regarding the positioning and dimensions of various elements relative to each other and are not intended to limit the orientation of the various embodiments to those explicitly discussed herein.

Embodiments disclosed herein relate to a layer and bank structure employable for an emissive display device (e.g., a QLED display). Application of implementations described below may result in increased emission efficiency, reduced color shift, and improved on-axis brightness for top-emitting QLED subpixel structures embedded in a high refractive index encapsulate material surrounded by a bank, while simultaneously minimizing an electrical current density across the subpixel. In some implementations, employing a minimum aspect ratio (e.g., a minimum ratio of length versus width, such as at least three, six, or nine) for an emissive area of a subpixel, as described more fully below, may provide such benefits. Also, in some implementations, emissive areas of a subpixel having some minimum aspect ratio (e.g., greater than one) may be aligned side-by-side (e.g., not end-to-end) within the subpixel.

FIG. 1 is a cross-sectional side view 100 of a top-emitting QLED subpixel stack 102 positioned atop a substrate 101, in accordance with an example implementation of the present disclosure. The term "top-emitting" may refer to the emission of light through a top electrode 107 rather than substrate 101. Although the following discussion primarily concerns QLED subpixels, embodiments discussed herein may also be applied in many embodiments to OLED subpixel structures.

Substrate 101 (e.g., glass) may be provided as a base upon which a relatively thick layer (e.g., greater than 80 nanometers (nm)) of metal reflector material (e.g., silver or aluminum) may be layered for use as a bottom electrode 103 (e.g., an anode). In some implementations, bottom electrode 103 may include aluminum, or a combination of silver and indium tin oxide (ITO). In some implementations, bottom electrode 103 may include two layers: a thick conductive metal (e.g., silver or aluminum) deposited on substrate 101, and an overlying (e.g., thinner, possibly at least partially transparent) conductive layer of ITO or indium zinc oxide (IZO).

A hole transport layer (HTL) 104 may be placed over electrode 103. In some implementations, HTL 104 may include two layers: a lower HTL 104A (e.g., poly(3,4-ethylenedioxythiophene) polystyrene sulfonate (PEDOT:PSS)) and an upper HTL 104B (e.g., poly(9,9'-dioctylfluorene-co-bis-N,N'-(4-butylphenyl)diphenylamine) (TFB)). In some implementations, a third layer (e.g., ITO or IZO, not explicitly depicted in FIG. 1) may also be present in HTL 104 between bottom electrode 103 and lower HTL 104A.

Atop HTL 104 may be a quantum-dot emissive layer (EML) 105. EML 105 may include a quantum dot material (e.g., cadmium selenide, indium phosphide, zinc selenide, or the like). Disposed over EML 105 may be an electron transport layer (ETL) 106 (e.g., nanoparticle Zinc Oxide (ZnO)). Over ETL 106 may be a top electrode 107 (e.g., cathode), which may be constructed of a thin metal layer (e.g., silver or a magnesium-silver alloy) such that top electrode 107 is substantially transparent to allow light emitted by QLED subpixel stack 102 to pass therethrough to a viewer.

While particular materials for the various layers of QLED subpixel stack 102 are mentioned above, other materials that result in an emissive subpixel stack may be employed in other implementations. Top-emitting QLED subpixel stack 102, when constructed as described above with bottom electrode 103 serving as an anode and top electrode 107 serving as a cathode, may be referred to as a "normal" QLED subpixel stack. In other implementations, an "inverted" stack may be employed in which top electrode 107 serves as an anode, bottom electrode 103 serves as a cathode, and ETL 106 and HTL 104 are swapped in position.

Figure 2:
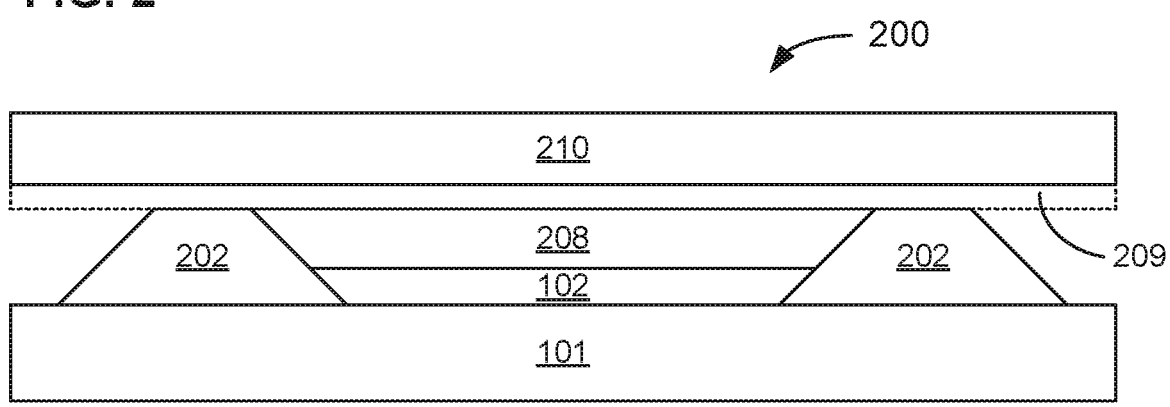
FIG. 2 is a cross-sectional side view of a QLED subpixel structure incorporating the QLED subpixel stack of FIG. 1, in accordance with an example implementation of the present disclosure.

FIG. 2 is a cross-sectional side view of a QLED subpixel structure 200 incorporating QLED subpixel stack 102 of FIG. 1, in accordance with an example implementation of the present disclosure. As shown, QLED subpixel stack 102, in whole or in part, may lie atop substrate 101 and be confined within a cavity formed by a bank (or bank structure) 202 that defines an outline of the subpixel. In some implementations, a space above QLED subpixel stack 102 within the cavity may be filled with a filler material 208 (e.g., an encapsulate material employed to protect QLED subpixel stack 102). Atop filler material 208 may be a low-index material 209 (e.g., air). Further, positioned atop low-index material 209 may be a cover material 210 (e.g., glass) to protect the underlying portions of QLED subpixel structure 200.

Filler material 208 may extract light from QLED subpixel stack 102 to a greater extent than air would as a consequence of a higher refractive index possessed by filler material 208 relative to that of air. In some implementations, a refractive index of filler material 208 may substantially match a refractive index of top electrode 107. In some implementations, filler material 208 may be encased on all sides at an edge of the emissive area of QLED subpixel structure 200 by bank 202, such as by providing a height for bank 202 such that a top surface of bank 202 substantially matches a top surface of filler material 208 or at least extends upward along a majority of the thickness of filler material 208. Consequently, while light trapped in QLED subpixel stack 102 may be quickly absorbed, light trapped in filler material 208 (which may be thicker than QLED subpixel stack 102) may propagate to a surface of bank 202 by way of total internal reflection (TIR) (e.g., as a result of low-index material 209 lying atop filler material 208) and may be extracted by reflection by the surface of bank 202. Additionally, in some implementations, low-index material 209 may prevent leakage of light from QLED subpixel stack 102 into a neighboring subpixel, thus preventing optical crosstalk therebetween via cover material 210 by facilitating absorption of unextracted light remaining in filler material 208. In some implementations, bank 202 may be opaque, and a surface of bank 202 facing filler material 208 may be scattering-reflective or specular-reflective.

Figure 3A:
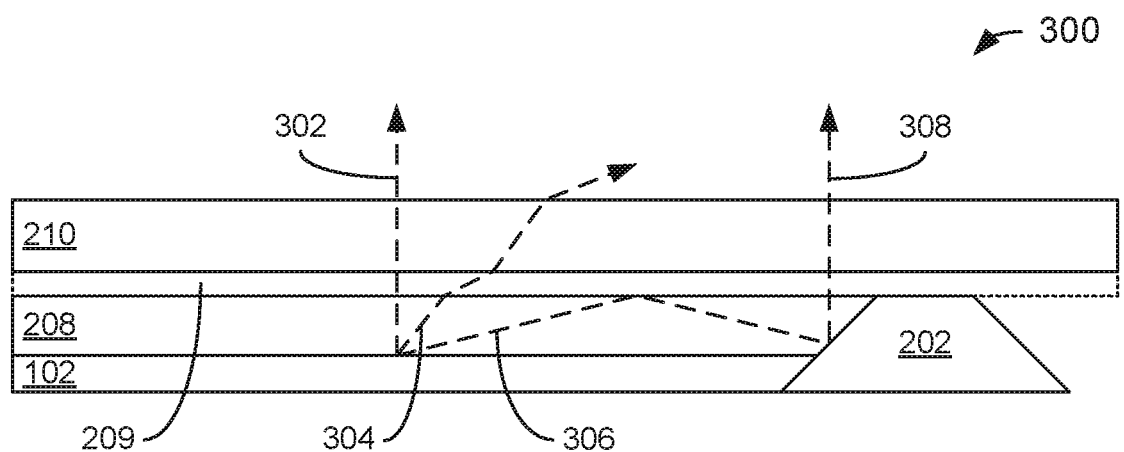
FIG. 3A is a side partial cross-sectional view of a QLED subpixel structure indicating light emission polar angles associated therewith, in accordance with an example implementation of the present disclosure.

FIG. 3A is a side partial cross-sectional view of a QLED subpixel structure 300 indicating light emission polar angles associated therewith, in accordance with an example implementation of the present disclosure. As with QLED subpixel structure 200 of FIG. 2, FIG. 3A depicts QLED subpixel stack 102, filler material 208, low-index material 209, cover material 210, and bank 202 of QLED subpixel structure 300. Superimposed upon this depiction are sample light emission paths 302 that are shown originating from the top surface of QLED subpixel stack 102. As employed, the polar angles of light emission paths 302 are measured relative to a direction normal, or "on-axis," to the layers of QLED subpixel structure 300.

More specifically, a first light emission path 302 is directed at a polar angle of zero degrees and is thus directed normal to each of the layers of QLED subpixel structure 300. Consequently, regardless of the refractive indexes of filler material 208, low-index material 209, and cover material 210, light of first light emission path 302 may be emitted on-axis, to be received by a viewer.

A second light emission path 304, however, is directed at an off-axis polar angle from QLED subpixel stack 102. Consequently, the refractive indexes of filler material 208, low-index material 209, and cover material 210 may result in a significantly off-axis direction of second light emission path 304 when exiting cover material 210.

A third light emission path 306 is directed at an even greater off-axis polar angle from QLED subpixel stack 102 sufficient to cause total internal reflection (TIR) at the interface of filler material 208 and low-index material 209, thus directing the light toward an angled surface of bank 202. In some implementations, the surface of bank 202 is angled such that light reflected by that surface of bank 202 is directed substantially on-axis as emitted light emission path 308. In some implementations, the slope angle of the surface of bank 202 may be chosen to be half of the emission polar angle of third light emission path 306.

Figure 3B:
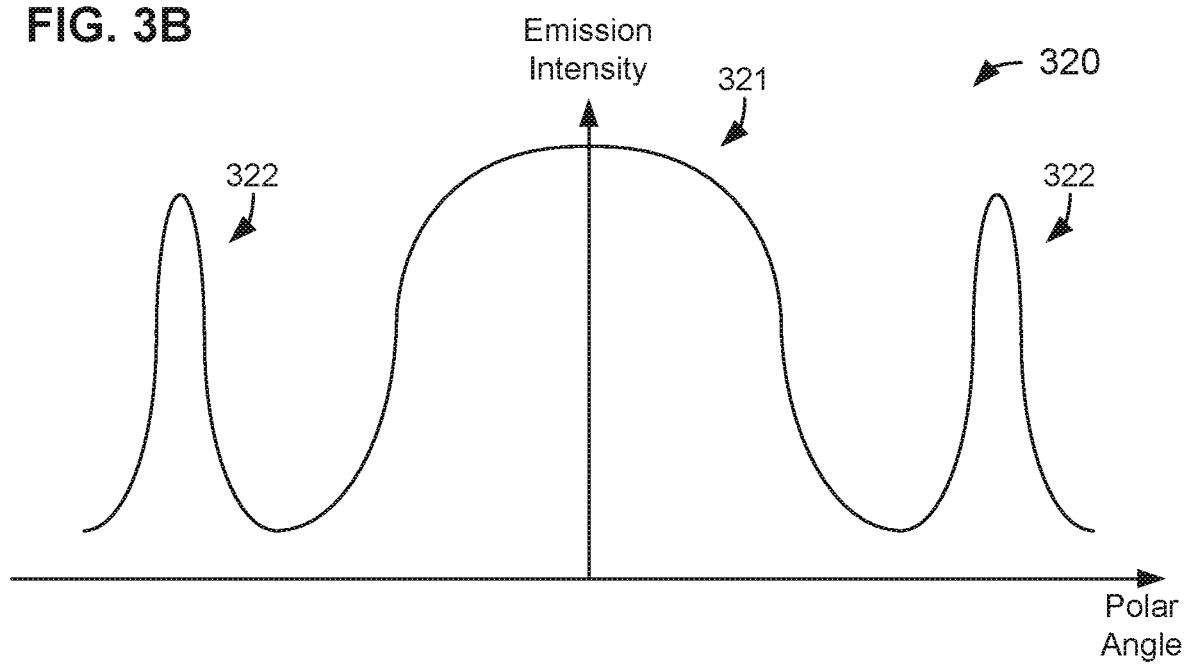
FIG. 3B is a graph of light emission intensity relative to light emission polar angle for the QLED subpixel structure of FIG. 3A, in accordance with an example implementation of the present disclosure.

Accordingly, in some implementations, to maximize on-axis emission from QLED subpixel structure 300, emission from QLED subpixel stack 102 into filler material 208 may be fashioned such that most of the light may be emitted either substantially on-axis (e.g., via first light emission path 302) or substantially at an angle that would redirect light via TIR toward bank 202 (e.g., via third light emission path 306). FIG. 3B is a graph 320 of light emission intensity relative to light emission polar angle for QLED subpixel structure 300 of FIG. 3A, in accordance with an example implementation of the present disclosure. More specifically, the emission intensity depicted in FIG. 3B is for light emitted from QLED subpixel stack 102 into filler material 208. Accordingly, a first emission intensity peak 321 is positioned substantially at a zero (on-axis) polar angle (e.g., via first light emission path 302 in FIG. 3A), and two second emission intensity peaks 322 at an off-axis polar angle that results in TIR (e.g., via third light emission path 306 in FIG. 3A). Further, light emission intensity may be substantially minimized at other polar angles (e.g., at second light emission path 304 in FIG. 3A). As a result, in some implementations, a high on-axis brightness may be achieved for QLED subpixel structure 300.

Referring to FIG. 1, in some implementations, with the use of transparent top electrode 107 of QLED pixel stack 102, the light emission distribution relative to polar angle (e.g., as shown in FIG. 3B) may be determined by a distance between EML 105 and reflecting bottom electrode 103 or another bottom reflective layer. As described below in conjunction with FIGS. 5A-5C, this distance may be selected by the thickness of one or more layers of QLED pixel stack 102 (e.g., HTL 104 in FIG. 1) to produce two peaks (e.g., first emission intensity peak 321 and second emission intensity peak 322) in the emission intensity relative to polar angle in filler material 208. In some implementations, these light emission peaks may occur due to constructive interference of light waves for greater on-axis emission, as described above.

In conjunction with the use of various implementations of QLED subpixel structure 300, as described above, emission efficiency may also be enhanced by the employment of multiple emissive areas within a single subpixel, where each emissive area may possess an advantageously high aspect ratio (e.g., a ratio of length to width), while providing additional benefits, such as reduced electrical current density.

Figure 4:
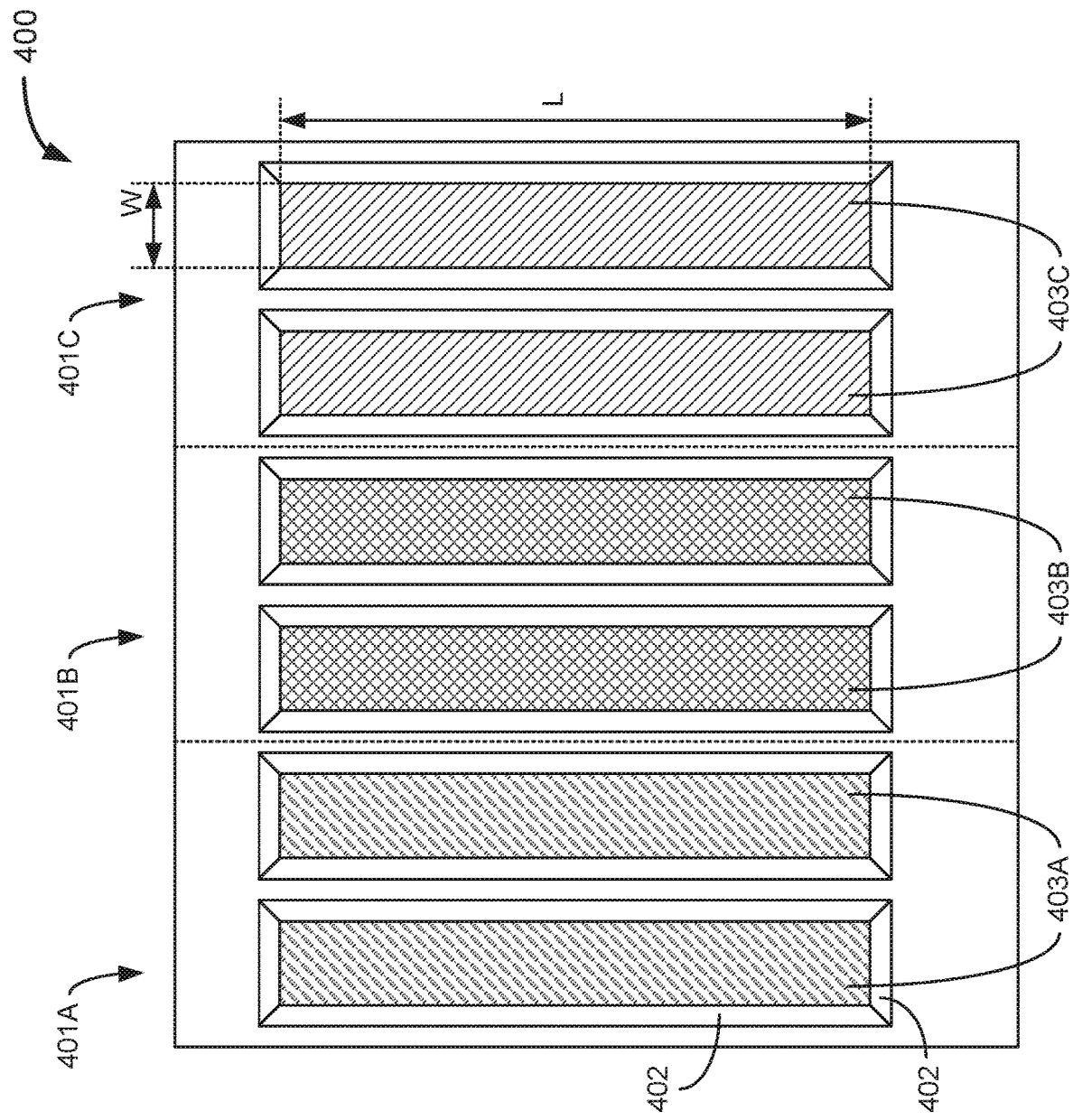
FIG. 4 is a top view of a QLED pixel having subpixels with multiple rectangular-shaped emissive areas, in accordance with an example implementation of the present disclosure.

FIG. 4 is a top view of a QLED pixel 400 having subpixels 401A, 401B, and 401C with respective multiple rectangular-shaped emissive areas 403A, 403B, and 403C, in accordance with an example implementation of the present disclosure. Further, as indicated above, a boundary of each emissive area 403A, 403B, and 403C (e.g., each of which may include an QLED pixel stack 102) may be defined by a bank 402. In some implementations, as illustrated in FIG. 4, emissive areas 403A, 403B, and 403C may possess a length L that is significantly greater than its width W. In some implementations, using such an aspect ratio (e.g., a ratio of length L to width W shorter than length L) for emissive areas 403A, 403B, and 403C may be advantageous over other aspect ratios or related sizes of emissive areas.

For example, a basic design parameter may be the relative size (e.g., larger or smaller) of each emissive area. Generally, the use of smaller emissive areas may facilitate the use of greater numbers of such areas in a single subpixel relative to a single large emissive area for a given overall subpixel area, including banks. Additionally, smaller emissive areas generally possess a shorter mean (average) lateral distance to the bank of that emissive area, and thus may suffer less light absorption compared to larger emissive areas. Consequently, smaller emissive areas may be both brighter for a given electrical current and more efficient in terms of light extraction compared to larger emissive areas.

In some cases, employing small multiple emissive areas, such as small circular emissive areas, may result in a significantly smaller utilization ratio for their associated subpixel. (As employed herein, a utilization ratio for a subpixel may be defined as a sum of the emissive areas as a fraction of a total area of the associated subpixel.) This smaller utilization ratio typically results from a minimum separation that may be incorporated between the small emissive areas to facilitate accurate fabrication. In addition, the additional bank structures, which may reflect light but do not self-emit light, may consume a significant amount of area in the subpixel. For example, while a typical subpixel in commercial use may possess a subpixel utilization ratio of 50% or more, the use of multiple small emissive areas and associated banks may result in a reduced subpixel utilization ratio of approximately 10-15%.

Further, given the smaller subpixel utilization ratio when utilizing small emissive areas, the resulting overall current density for these smaller emissive areas may be higher. For example, when a smaller emissive area and a larger emissive area are driven with the same electrical current, and thus the same electrical power, the smaller emissive area may be significantly brighter, and thus more efficient, than the larger emissive area. However, as this current is concentrated in a smaller overall emissive area, the current density of the smaller emissive area may be greater, thus potentially reducing the operating lifetime of the display due to localized heating. Such may be the case even if the overall electrical current for the small emissive areas of the subpixel is reduced such that the small emissive areas provide the same brightness as a subpixel with fewer, larger emissive areas. Further, manufacture of such small emissive areas may result in materials-related effects that could significantly affect fabrication yield and non-optical efficiency, or "droop".

In contrast to fewer, relatively large emissive areas, or more numerous, relatively small (e.g., circular) emissive areas, multiple rectangular-shaped emissive areas 403A, 403B, and 403C of QLED pixel 400 of FIG. 4 may provide a much higher subpixel utilization ratio (e.g., by providing a greater overall emissive area per subpixel) due to length L of each emissive area 403A, 403B, and 403C. Simultaneously, a substantial fraction of the light emitted by the subpixel stack of each emissive area 403A, 403B, and 403C may reach bank 402 after a short distance, due to width W of each emissive area 403A, 403B, and 403C. In some implementations, such an effect may be enhanced with increased emissive area aspect ratio (e.g., longer length L and/or narrower width W). Thus, light collimation (e.g., by way of bank 402 reflecting light in an on-axis direction, as discussed above in conjunction with FIGS. 3A and 3B) and efficiency gain similar to that of small emissive areas may be substantially maintained. Moreover, the substantial increase in emissive area aspect ratio (length L versus width W), with its attendant increase in overall subpixel utilization ratio, may improve the overall subpixel brightness such that, for a given brightness, the resulting electrical current density may be less than that for a large emissive area, with associated improvements in lifetime and material performance.

Additionally, with an overall larger emissive area 403A, 403B, and 403C (e.g., due to the length L), an amount of non-uniformity in the thickness of deposited layers of the QLED stack that may otherwise be caused by bank 402 may be reduced. More specifically, an expected increase in layer thickness of QLED subpixel stack 102 of each emissive area 403A, 403B, and 403C toward a surface of bank 402 may consume a lower proportion of the overall emissive area. As a result, various implementations of the present disclosure may result in improved on-axis brightness (e.g., apparent brightness to the user) and efficiency, excellent reduction of off-axis color shift, low current density in emissive areas of the pixel (e.g., resulting in better lifetime properties for the same brightness improvement), and fewer deposition challenges.

In some implementations, as indicated above, increasing the emissive area aspect ratio (e.g., by increasing length L relative to width W) of each emissive area 403A, 403B, and 403C may result in an increase in overall emissive area, and thus may increase overall brightness. However, in some implementations, such improvement may not continue as length L is increased beyond some limit.

Also, in some implementations, some optimally narrow width W for emissive areas 403A, 403B, and 403C with surrounding bank 402 may result in a maximum efficiency improvement, in a fashion similar to a minimum diameter for a small (e.g., circular) emissive area, as mentioned above. In some implementations, this optimum width W may cause any light ray emitted in any direction from QLED subpixel stack 102 that is subject to TIR on the boundary between filler material 208 and low-index material 209 to be (1) incident with this boundary no more than twice and (2) incident at the interface between filler material 208 and QLED subpixel stack 102 no more than once prior to encountering bank 402. Consequently, light emission from a center of emissive area 403A, 403B, and 403C may not impact QLED subpixel stack 102 a second time before reaching bank 402. In some implementations, further reduction in width W may result in progressively reduced efficiency.

Combining a reduced width W (e.g., to improve emission efficiency) with an increased length L (e.g., to increase a total area of light emission) of emissive areas 403A, 403B, and 403C, the electrical current density and associated power may be limited while simultaneously improving overall brightness for subpixels 401A, 401B, and 401C. In some implementations, such as in the use of a single emissive area 403A, 403B, and 403C for each subpixel 401A, 401B, and 401C of pixel 400, an emissive area having a length L that is three times the width W of emissive area 403A, 403B, and 403C may provide such benefits while maintaining pixel 400 in a substantially square configuration while improving emission efficiency and at least maintaining overall brightness.

In an example, simulation of a conventional QLED subpixel employing a single emissive area may achieve an external quantum efficiency (EQE) of 6.6% and a brightness of 1,263 candela-per-square-meter (cd/m$^2$) with an electrical current density of 10 milliamperes-per-square-centimeter (mA/cm$^2$). Employing instead a subpixel having seven circular emissive areas of a size as described above may result in an EQE of 16.8% (2.54 times the conventional subpixel), a brightness of 2,499 cd/m$^2$ (1.97 times the conventional subpixel), but with a heightened current density of 45 mA/cm$^2$ (4.5 times the conventional subpixel). Reducing the brightness of the subpixel having such circular emissive areas to 1,263 cd/m$^2$ (e.g., the same as the conventional subpixel) will still give a heightened current density of 22.7 mA/cm$^2$ (2.27 times the conventional subpixel), thus possibly resulting in a reduced display lifetime.

However, use of two elongated emissive areas having an increased emissive area aspect ratio of approximately nine in a single subpixel may produce an EQE of 14.0% (2.12 times the conventional subpixel) and a brightness of 1,917 cd/m$^2$ (1.52 the conventional subpixel) with a current density of 13.5 mA/m$^2$ (1.35 times the conventional subpixel). If the brightness is then reduced to 1,263 cd/m$^2$ (e.g., the same as the conventional subpixel), a reduced current density of 8.9 mA/cm$^2$ (0.89 times the conventional subpixel) may result.

In another implementation where the two emissive areas may have the same length and may have a width that is increased such that the emissive area aspect ratio is now 6.7, this implementation may provide an EQE of 13.7% (2.08 times the conventional pixel) and a brightness of 1,884 cd/m$^2$ (1.49 times the conventional pixel) with a current density of 9.7 mA/m$^2$ (0.97 times the conventional pixel). Alternatively, for the same brightness of 1,263 cd/m$^2$ as the conventional pixel, a current density of 6.5 mA/m$^2$ (0.65 times the conventional pixel) may be achieved.

In view of various implementations discussed above, in some implementations, an aspect ratio for one or more emissive areas (e.g., length L versus width W) may be three, six, or nine. More generally, the aspect ratio for the one or more emissive areas may be at least three, or more specifically, may be at least six.

Additionally, in some implementations, such as those described below, at least a majority (e.g., an entirety) of the emissive areas of a subpixel (e.g., emissive areas 403A of subpixel 401A) may be arranged successively widthwise (e.g., side-by-side, as opposed to end-to-end) along an axis defined by a combination of the lengths and widths of the subpixels and the associated emissive areas. More specifically, in some implementations, a subpixel may be characterized by a length and a width (less than the length) of an entire area associated with the subpixel, which includes the emissive areas of that subpixel. Consequently, an aspect ratio for the subpixel may be defined as a ratio of the length to the width of the subpixel. Further, a primary axis may be defined as aligning with the length of the subpixel when the subpixel aspect ratio is greater than the emissive area aspect ratio. Otherwise, the primary axis may be defined as aligning with the length of one of the emissive areas. Thus, given such a primary axis, the majority of the emissive areas may be arranged widthwise along a secondary axis perpendicular to the primary axis. For example, as shown in FIG. 4, the aspect ratios of emissive areas 403A, 403B, and 403C are greater than the aspect ratios of respective subpixels 401A, 401B, and 401C, a primary axis may be defined vertically along the length of each emissive area, with the emissive areas being arranged side-by-side along a secondary axis perpendicular to the primary axis (e.g., the secondary axis being oriented horizontally). Also, in some implementations, the aspect ratio of these emissive areas (length versus width) may be greater than one (e.g., three, six, nine, and so on, as discussed above).

Figure 5A:
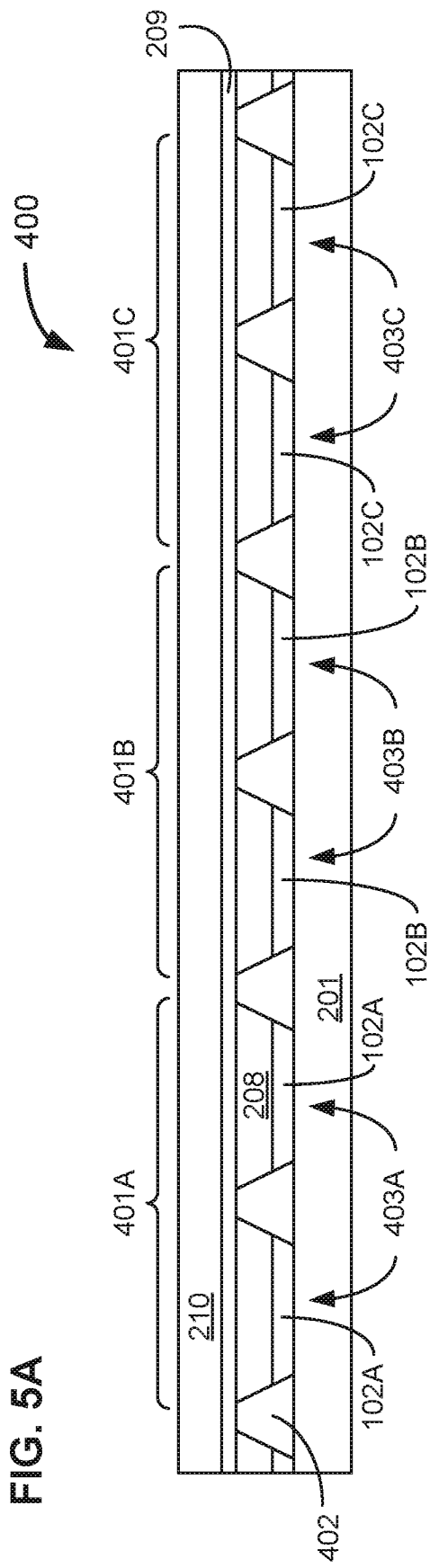
FIG. 5A is a side cross-sectional view of the QLED pixel of FIG. 4, in accordance with an example implementation of the present disclosure.

FIG. 5A is a side cross-sectional view of QLED pixel 400 of FIG. 4, in accordance with an example implementation of the present disclosure. As discussed above, each subpixel 401A, 401B, and 401C of QLED pixel 400 may respectively include two emissive areas 403A, 403B, and 403C. Further, each emissive area 403A, 403B, and 403C may respectively include a corresponding QLED subpixel stack 102A, 102B, and 102C (similar to QLED pixel stack 102 of FIG. 1). Each emissive area 403A, 403B, and 403C may also include a corresponding individual filler material 208 separated by banks 402. Atop filler material 208 portions, low-index material 209 and cover material 210 may be disposed, in a manner similar to QLED subpixel structure 200 of FIG. 2. In some implementations, as shown, low-index material 209 and cover material 210 may extend as single layers across an entirety of QLED pixel 400.

Figure 5B:
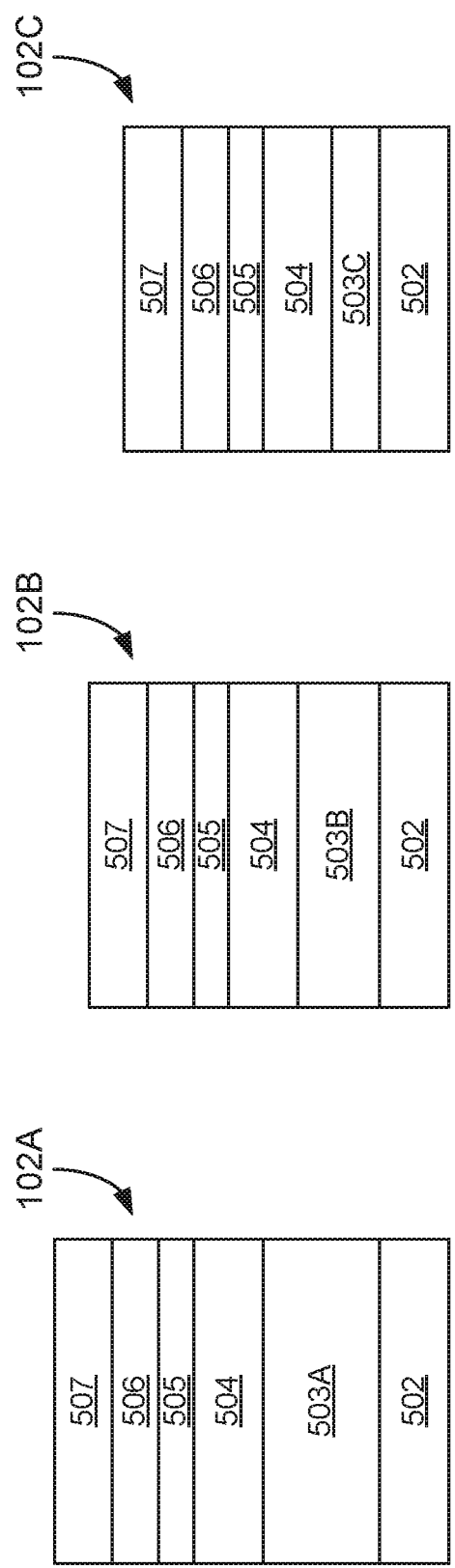
FIG. 5B is a side cross-sectional view of QLED subpixel stacks of the QLED pixel of FIG. 5A in which an anode thickness varies, in accordance with an example implementation of the present disclosure.

FIG. 5B is a side cross-sectional view of QLED subpixel stacks 102A, 102B, and 102C of QLED pixel 400 of FIG. 5A in which an anode 503A, 503B, and 503C thickness may vary, in accordance with an example implementation of the present disclosure. As illustrated, each QLED subpixel stack 102A, 102B, and 102C may include a bottom reflector layer 502, a HTL 504, an EML 505, an ETL 506, and a top electrode (e.g., cathode) 507. Moreover, each QLED subpixel stack 102A, 102B, and 102C respectively may include a corresponding bottom electrode (e.g., an anode) 503A, 503B, and 503C. In some implementations, bottom electrodes 503A, 503B, and 503C may possess different thicknesses between QLED subpixel stacks 102A, 102B, and 102C to compensate for the different wavelengths corresponding to each QLED subpixel stack 102A, 102B, and 102C (e.g., for red, green, and blue wavelengths emitted by EML 505). Further, a difference in thickness of bottom electrodes 503A, 503B, and 503C may facilitate a light emission distribution relative to polar angle that produces first emission intensity peak 321 and second emission intensity peak 322, as discussed above in connection with FIGS. 3A and 3B.

Figure 5C:
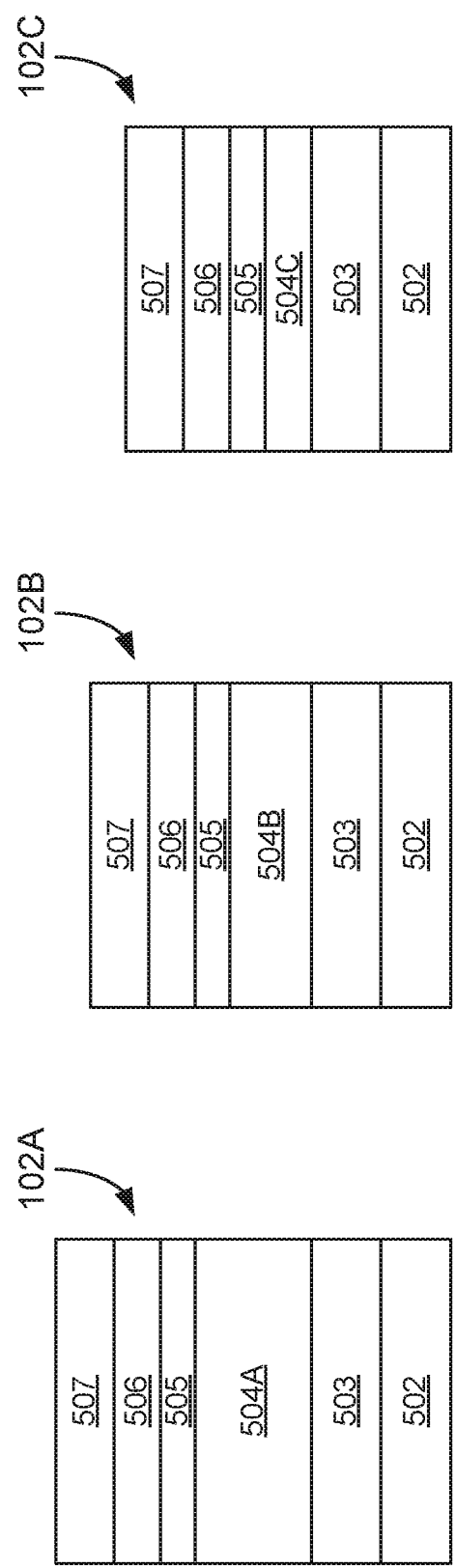
FIG. 5C is a side cross-sectional view of QLED subpixel stacks of the QLED pixel of FIG. 5A, in which a hole transport layer thickness varies, in accordance with an example implementation of the present disclosure.

FIG. 5C is a side cross-sectional view of QLED subpixel stacks 102A, 102B, and 102C of QLED pixel 400 of FIG. 5A, in which a hole transport layer 504A, 504B, and 504C thickness may vary, in accordance with an example implementation of the present disclosure. As depicted, each QLED subpixel stack 102A, 102B, and 102C may include bottom reflector layer 502, bottom electrode (e.g., anode) 503, EML 505, ETL 506, and top electrode (e.g., cathode) 507. Additionally, each QLED subpixel stack 102A, 102B, and 102C respectively may include a corresponding HTL 504A, 504B, and 504C. In some implementations, HTL 504A, 504B, and 504C may possess different thicknesses between QLED subpixel stacks 102A, 102B, and 102C to compensate for the different wavelengths corresponding to each QLED subpixel stack 102A, 102B, and 102C (e.g., for red, green, and blue wavelengths emitted by EML 505). Further, a difference in thickness of HTL 504A, 504B, and 504C may produce a light emission distribution relative to polar angle that produces first emission intensity peak 321 and second emission intensity peak 322, as described above in connection with FIGS. 3A and 3B.

In FIGS. 5B and 5C, some layers of each QLED subpixel stack 102A, 102B, and 102C (e.g., anode 503, HTL 504, and/or ETL 506) may be localized within its corresponding emissive area 403A, 403B, and 403C. Consequently, these layers may not cross over bank 402. In some other implementations, one or more of these layers may be continuous and of the same or similar thickness across all pixels 400 and subpixels 401A, 401B, and 401C. In some implementations, EML 505 may be different for different emissive areas 403A, 403B, and 403C, and thus may be localized therewithin. Also, bottom reflector 502 and/or bottom electrode 503 may be localized in each emissive area 403A, 403B, and 403C, as these layers provide the control current for the corresponding emissive area 403A, 403B, and 403C. In the alternative, in some implementations, EML 505, bottom reflector 502, and/or bottom electrode 503 may be continuous across all emissive areas 403A, 403B, and 403C of a single subpixel 401A, 401B, and 401C, as those emissive areas may be driven to emit the same amount of light at the same time. Additionally, layers that are different in thickness between subpixels 401A, 401B, and 401C (e.g., bottom electrodes 503A, 503B, and 503C of FIG. 5B and HTL 504A, 504B, and 504C in FIG. 5C) may also be localized to facilitate those differences to compensate for wavelength and/or provide the desired light emission behavior relative to polar angle, as described above in connection with FIGS. 3A and 3B. Additionally, top electrode (e.g., cathode) 507 may be continuous and of equal thickness across all pixels 400 and subpixels 401A, 401B, and 401C, as cathode 507 may serve as a reference, or common, electrode for the display.

Figure 6:
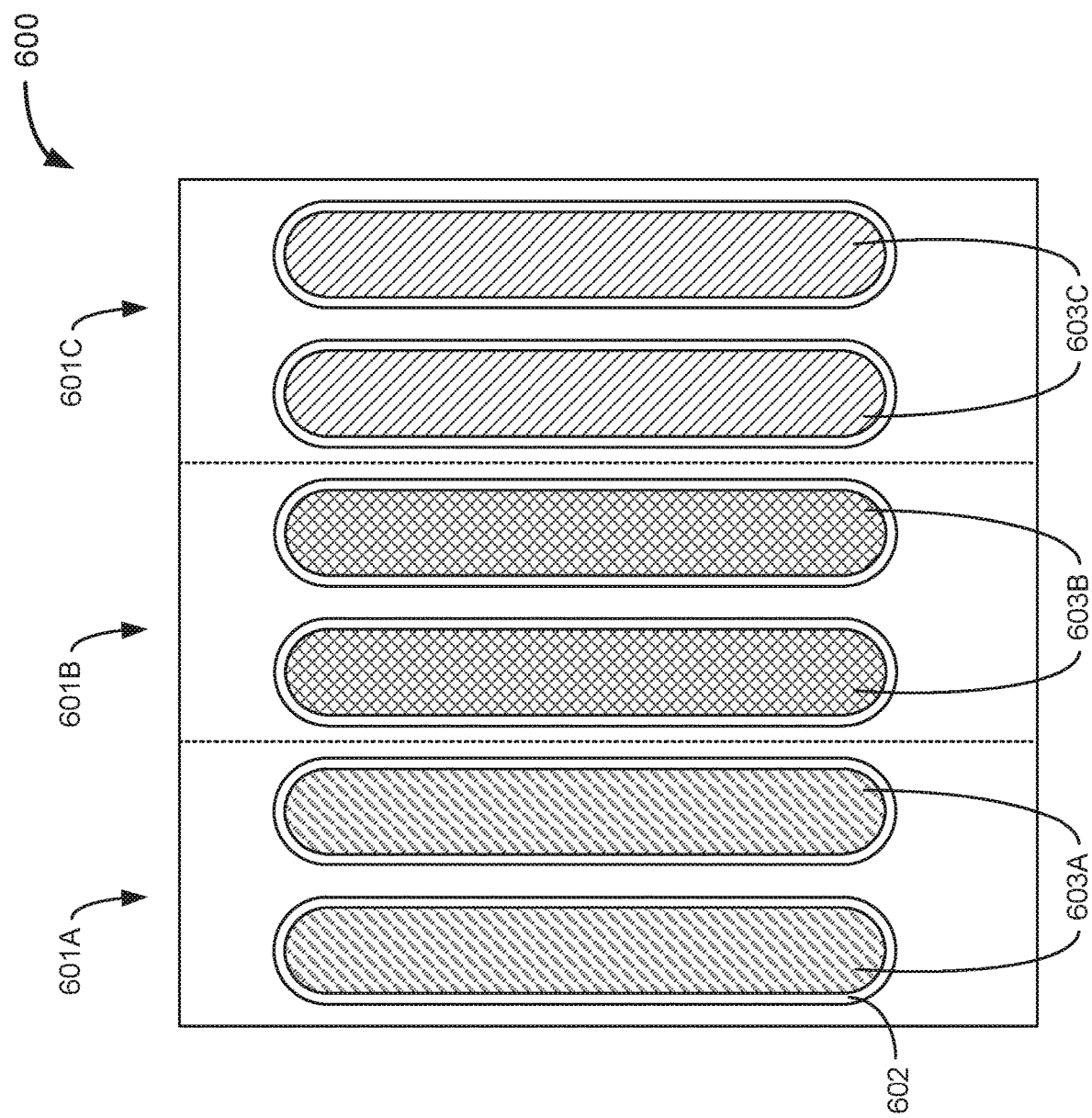
FIG. 6 is a top view of a QLED pixel having subpixels with two geometric stadium-shaped emissive areas, in accordance with an example implementation of the present disclosure.

FIG. 6 is a top view of a QLED pixel 600 having subpixels 601A, 601B, and 601C respectively having two geometric stadium-shaped emissive areas 603A, 603B, and 603C, in accordance with an example implementation of the present disclosure. Compared to rectangular-shaped emissive areas 403A, 403B, and 403C of FIG. 4, the continuous (e.g., smoother) outline of stadium-shaped emissive areas 603A, 603B, and 603C may provide similar benefits in terms of greater emission efficiency, reduced current density, and the like, while also possibly being easier to fabricate than a rectangular shape. In some implementations, such as shown in FIG. 6, emissive areas 603A, 603B, and 603C of each respective subpixel 601A, 601B, and 601C are aligned side-by-side (e.g., the widths of the emissive areas being aligned successively within the corresponding subpixel).

Figure 7:
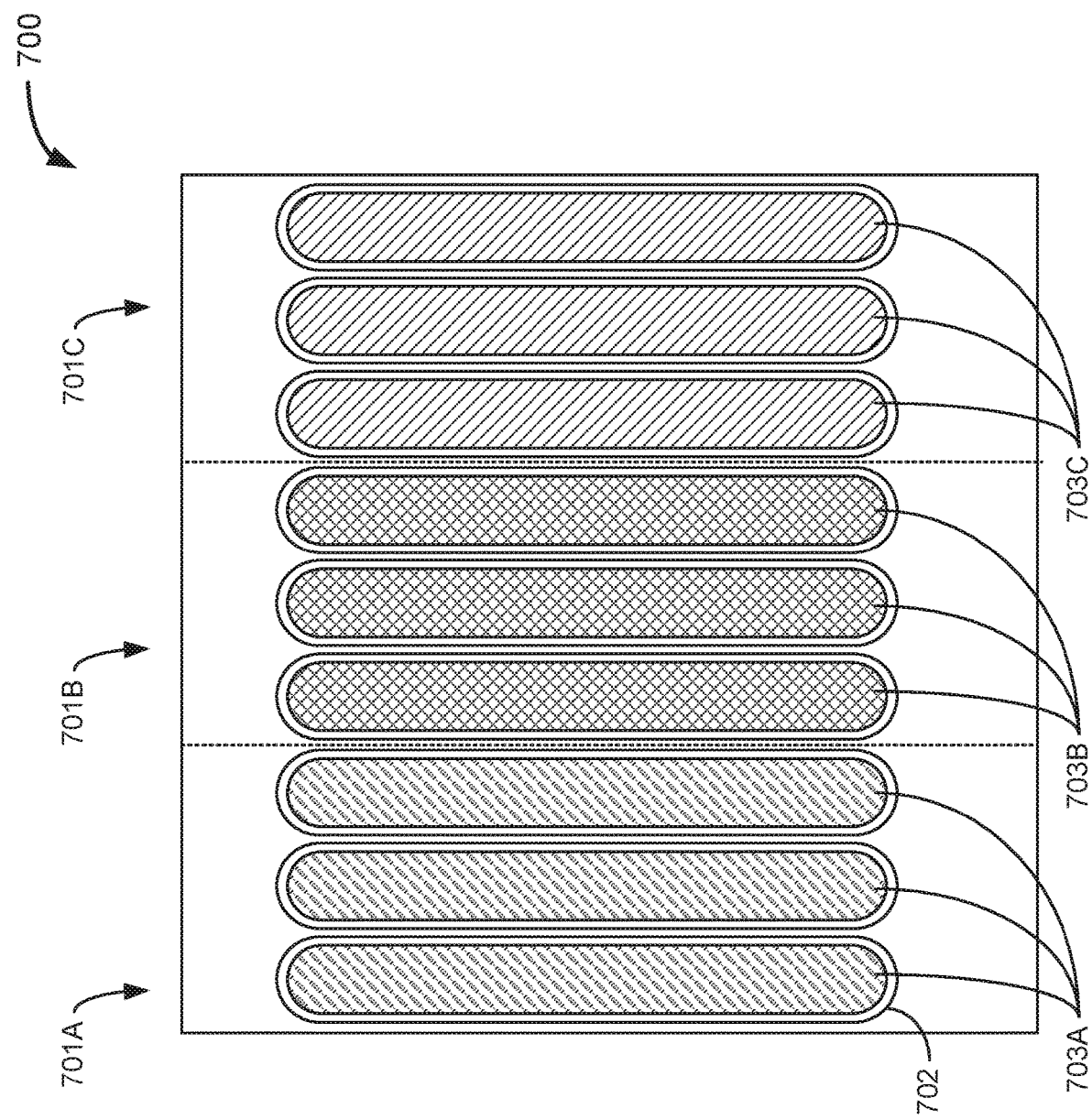
FIG. 7 is a top view of a QLED pixel having subpixels with three geometric stadium-shaped emissive areas, in accordance with an example implementation of the present disclosure.

FIG. 7 is a top view of a QLED pixel 700 having subpixels 701A, 701B, and 701C respectively with three geometric stadium-shaped emissive areas 703A, 703B, and 703C, in accordance with an example implementation of the present disclosure. Each emissive area 703A, 703B, and 703C may also be defined and surrounded by one or more banks 702. In some implementations, the additional emissive areas may provide additional brightness and/or reduced current density. In other implementations, more than three emissive areas per subpixel may be employed. Also, in some implementations, emissive areas 703A, 703B, and 703C within each respective subpixel 701A, 701B, and 701C may be aligned widthwise or side-by-side, as illustrated in FIG. 7.

Figure 8:
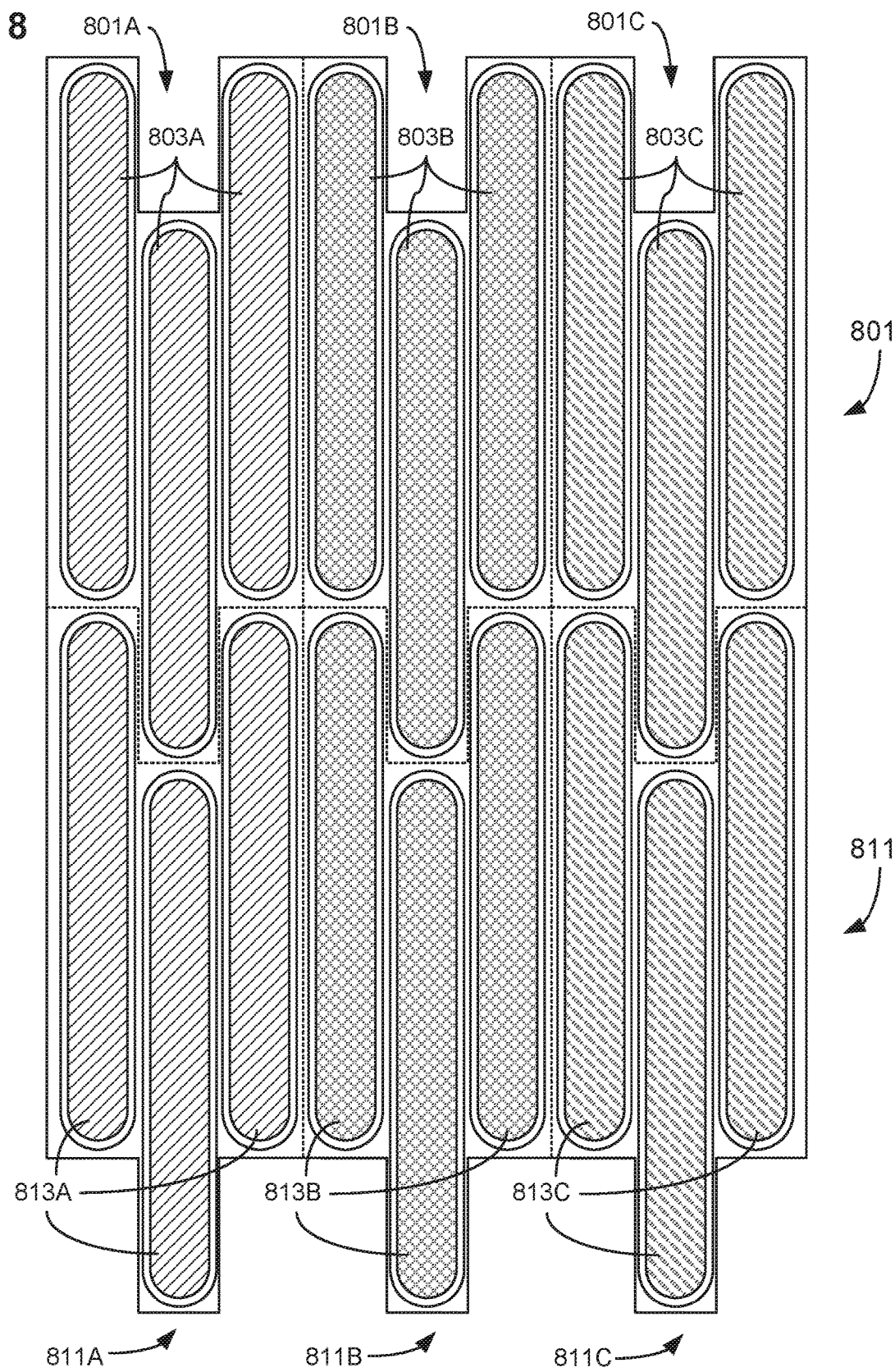
FIG. 8 is a top view of adjacent QLED pixels having subpixels with three geometric stadium-shaped emissive areas, in which the ends of the emissive areas of each subpixel are not aligned, in accordance with an example implementation of the present disclosure.

FIG. 8 is a top view of adjacent QLED pixels 801 and 811 having subpixels with three geometric stadium-shaped emissive areas, in which ends of the emissive areas of each subpixel are not aligned, in accordance with an example implementation of the present disclosure. More specifically, QLED pixel 801 includes subpixels 801A, 801B and 801C, and QLED pixel 811 includes subpixels 811A, 811B and 811C. Further, each subpixel 801A, 801B, and 801C respectively includes emissive areas 803A, 803B, and 803C, and each subpixel 811A, 811B, and 811C respectively includes emissive areas 813A, 813B, and 813C. While this "staggered" alignment employs three emissive areas per subpixel, two emissive areas per subpixel, or more than three emissive areas per subpixel, may be employed in other implementations. Additionally, while FIG. 8 illustrates a side-by-side emissive area overlap of approximately two-thirds, other levels of overlap may be employed in other examples. Also, as depicted in FIG. 8, each subpixel 801A, 801B, 801C, 811A, 811B, and 811C may be shaped to closely outline respective emissive areas 803A, 803B, 803C, 813A, 813B, and 813C such that emissive areas of adjacent pixels 801 and 811 (e.g., pixels located in adjacent pixel rows of a display) may be interlaced or "meshed" together, thus reducing the overall amount of non-emissive area in the display.

Figure 9:
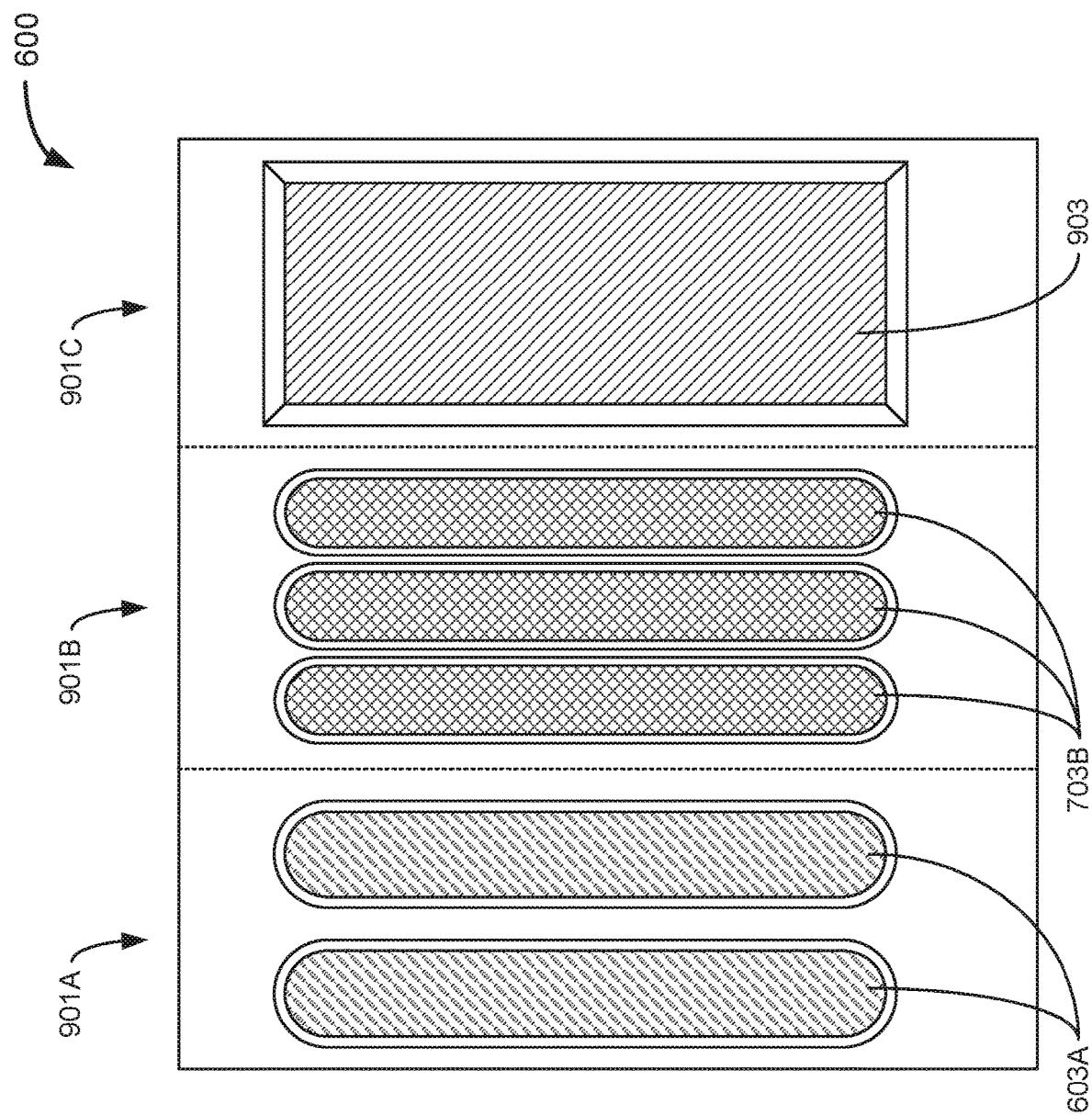
FIG. 9 is a top view of a QLED pixel having subpixels with varying numbers, sizes, and shapes of emissive areas, in accordance with an example implementation of the present disclosure.

FIG. 9 is a top view of a QLED pixel 900 having subpixels 901A, 901B, and 901C with varying numbers, sizes, and shapes of emissive areas, in accordance with an example implementation of the present disclosure. More specifically, as shown in FIG. 9, subpixel 901A may include two stadium-shaped emissive areas 603A (from FIG. 6), subpixel 901B may have three stadium-shaped emissive areas 703B (from FIG. 7), and subpixel 901C may include a single rectangular-shaped emissive area 903. Despite the variety of numbers, shapes, and sizes of emissive areas employed, each subpixel 901A, 901B, and 901C may be the same or similar in overall size and/or shape, as depicted in FIG. 9. Many other combinations of number, size, and shape of emissive areas employed within a single pixel are also possible and are not limited to the example combinations provided herein.

Figure 10:
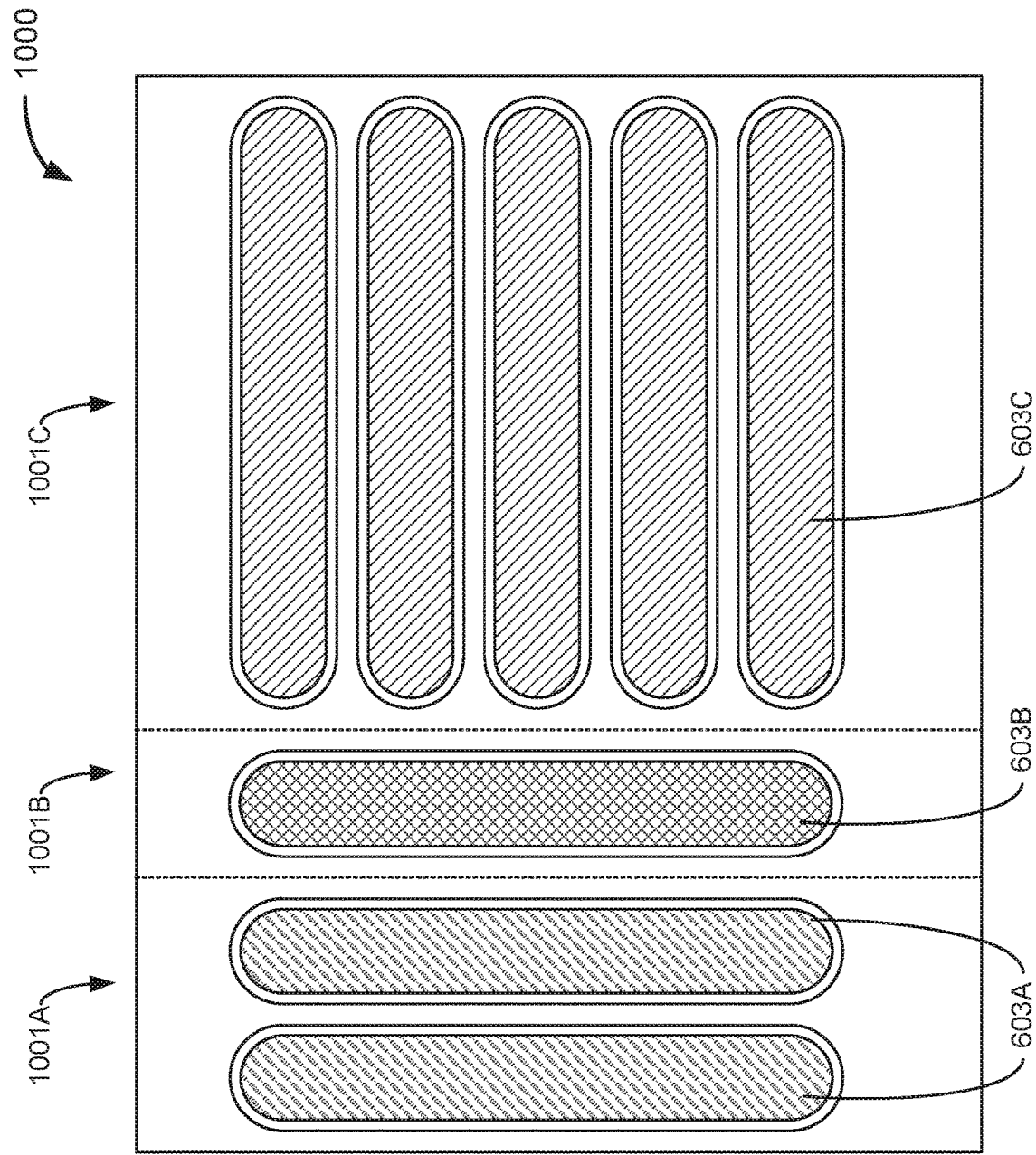
FIG. 10 is a top view of a QLED pixel having subpixels with varying numbers and alignments of emissive areas, in accordance with an example implementation of the present disclosure.

FIG. 10 is a top view of a QLED pixel 1000 having subpixels 1001A, 1001B, and 1001C with varying numbers and alignments of emissive areas, in accordance with an example implementation of the present disclosure. In this case, subpixel 1001A may include two emissive areas 603A (FIG. 6), subpixel 1001B may include three emissive areas 603B (FIG. 6), and subpixel 1001C may include five emissive areas 603C (FIG. 6). Further, emissive areas 603C may align perpendicularly to emissive areas 603A and 603B. Moreover, since subpixel 1001C has a substantially smaller aspect ratio (length (vertical) versus width (horizontal)) than emissive areas 603C, the lengths of emissive areas 603C may also be aligned vertically, in the same direction as emissive areas 603A of subpixel 1001A, in some implementations. Also, in some implementations, this variation in numbers and alignments of emissive areas 603A, 603B, and 603C may be employed to provide better white balance using different extracted brightness levels from each of the three subpixels 1001A, 1001B, and 1001C associated with different colors (e.g., red, green, and blue). Also, as shown in FIG. 10, such variations may result in different footprint areas for subpixels 1001A, 1001B, and 1001C. In other implementations, other variations in numbers and alignments of emissive areas may be employed and are not limited to the example numbers and alignments provided herein.

Embodiments of the present disclosure may be applicable to many display devices to permit display devices exhibiting high emission efficiency and brightness, while controlling or limiting electrical current density to extend display lifetime. Examples of such devices may include televisions, mobile phones, personal digital assistants (PDAs), tablet computers, laptop computers, desktop monitors, digital cameras, and like devices for which a high-resolution display is desirable.

From the above discussion, it is evident that various techniques can be utilized for implementing the concepts of the present disclosure without departing from the scope of those concepts. Moreover, while the concepts have been described with specific reference to certain implementations, a person of ordinary skill in the art would recognize that changes can be made in form and detail without departing from the scope of those concepts. As such, the disclosure is to be considered in all respects as illustrative and not restrictive. It should also be understood that the present disclosure is not limited to the particular described implementations, but that many rearrangements, modifications, and substitutions are possible without departing from the scope of the present disclosure.

What is claimed is:

1. A top-emitting subpixel structure comprising:
   at least one bank structure disposed on a substrate and having reflective non-vertical surfaces defining a plurality of emissive areas of a subpixel configured to emit light of a first color; and
   a plurality of emissive structures each of which located in each emissive area in the plurality of emissive areas, each emissive structure comprising:
     a reflective bottom electrode disposed over the substrate;
     an emissive layer disposed over the reflective bottom electrode;
     a transparent top electrode disposed over the emissive layer; and
     a filler layer disposed atop and in contact with the transparent top electrode, the filler layer having a refractive index substantially equal to a refractive index of the transparent top electrode, wherein:
   the subpixel structure has a subpixel length and a subpixel width less than the subpixel length,
   a ratio of the subpixel length to the subpixel width defines a subpixel aspect ratio,
   each emissive area in the plurality of emissive areas has an emissive area length and an emissive area width less than the emissive area length, a ratio of the emissive area length to the emissive area width defines an emissive area aspect ratio, the subpixel length defines a primary axis when the subpixel aspect ratio is greater than the emissive area aspect ratio, otherwise the emissive area length defines the primary axis, at least a majority of the plurality of emissive areas is arranged successively widthwise along a secondary axis perpendicular to the primary axis, and the plurality of emissive areas is arranged in a staggered pattern.

2. The top-emitting subpixel structure of claim 1, wherein the at least majority of the plurality of emissive areas comprises an entirety of the plurality of emissive areas.

3. The top-emitting subpixel structure of claim 1, further comprising:

a glass cover material disposed over the filler layer; and an intermediate layer disposed between the filler layer and the glass cover material, the intermediate layer having a refractive index lower than the refractive index of the filler layer.

4. The top-emitting subpixel structure of claim 3, wherein the glass cover material is common to the plurality of emissive areas.

5. The top-emitting subpixel structure of claim 3, wherein the intermediate layer comprises air.

6. The top-emitting subpixel structure of claim 1, wherein a distance between the reflective bottom electrode and the emissive layer is configured to generate:

a first light emission peak directed normal to the emissive layer; and a second light emission peak directed at an angle to the emissive layer within the filler layer such that light of the second light emission peak is reflected by total internal reflection at an upper interface of the filler layer toward at least one of the reflective non-vertical surfaces of the at least one bank structure.

7. The top-emitting subpixel structure of claim 6, wherein the at least one of the reflective non-vertical surfaces is angled such that the light of the second light emission peak is directed from the at least one of the reflective non-vertical surfaces normal to the emissive layer.

8. The top-emitting subpixel structure of claim 1, wherein:

each emissive area in the plurality of emissive areas defines a first end in a plurality of first ends and a second end in a plurality of second ends along the primary axis;

the plurality of first ends of the plurality of emissive areas aligns perpendicularly to the primary axis; and the plurality of second ends of the plurality of emissive areas aligns perpendicularly to the primary axis.

9. The top-emitting subpixel structure of claim 1, wherein:

each emissive area in the plurality of emissive areas defines a first end in a plurality of first ends and a second end in a plurality of second ends along the primary axis;

the plurality of first ends of the plurality of emissive areas does not align perpendicularly to the primary axis; and the plurality of second ends of the plurality of emissive areas does not align perpendicularly to the primary axis.

10. The top-emitting subpixel structure of claim 1, wherein a plurality of the reflective bottom electrodes of the plurality of emissive structures is driven by a common control signal.

11. The top-emitting subpixel structure of claim 1, wherein at least one of the plurality of emissive areas comprises a rectangular shape.

12. The top-emitting subpixel structure of claim 1, wherein at least one of the plurality of emissive areas comprises a geometric stadium shape.

13. A display device comprising:

a plurality of pixels, each pixel of the plurality of pixels comprising a plurality of subpixels, each subpixel in the plurality of subpixels in each of the plurality of pixels being configured to emit light of a corresponding color, each subpixel in the plurality of subpixels comprising:

at least one bank structure disposed on a substrate and having reflective non-vertical surfaces defining a plurality of emissive areas; and a plurality of emissive structures each of which located in each emissive area in the plurality of emissive areas, each emissive structure comprising:

a reflective bottom electrode disposed over the substrate;

an emissive layer disposed over the reflective bottom electrode;

a transparent top electrode disposed over the emissive layer; and a filler layer disposed atop and in contact with the transparent top electrode, the filler layer having a refractive index substantially equal to a refractive index of the transparent top electrode, wherein the subpixel has a subpixel length and a subpixel width less than the subpixel length, a ratio of the subpixel length to the subpixel width defines a subpixel aspect ratio, each emissive area in the plurality of emissive areas has an emissive area length and an emissive area width less than the emissive area length, a ratio of the emissive area length to the emissive area width defines an emissive area aspect ratio, the subpixel length defines a primary axis when the subpixel aspect ratio is greater than the emissive area aspect ratio, otherwise the emissive area length defines the primary axis, at least a majority of the plurality of emissive areas being arranged successively widthwise along a secondary axis perpendicular to the primary axis, and the plurality of emissive areas is arranged in a staggered pattern.

14. The display device of claim 13, wherein a distance between the reflective bottom electrode and the emissive layer is configured to generate:

a first light emission peak directed normal to the emissive layer; and a second light emission peak directed at an angle to the emissive layer within the filler layer such that light of the second light emission peak is reflected by total internal reflection at an upper interface of the filler layer toward at least one of the reflective non-vertical surfaces of the at least one bank structure, wherein the at least one of the reflective non-vertical surfaces is angled such that the light of the second light emission peak is directed from the at least one of the reflective non-vertical surfaces normal to the emissive layer.

15. The display device of claim 13, wherein the primary axis associated with a first subpixel of a pixel is not parallel to the primary axis associated with a second subpixel of the pixel.

16. The display device of claim 13, wherein a number of emissive areas of each subpixel of a pixel of the plurality of pixels are equal.

17. The display device of claim 13, wherein a number of emissive areas of a first subpixel of a pixel of the plurality of pixels are not equal to a number of emissive areas of a second subpixel of the pixel of the plurality of pixels.

18. The display device of claim 13, wherein a size of each emissive area of each subpixel of a pixel of the plurality of pixels are equal.

19. The display device of claim 13, wherein a size of an emissive area of a first subpixel of a pixel of the plurality of pixels is not equal to a size of at least one emissive area of a second subpixel of the pixel of the plurality of pixels.

20. The display device of claim 13, wherein each emissive area of at least one subpixel of a pixel of the plurality of pixels comprises a geometric stadium shape.

* * * * *